(12) United States Patent
Auth et al.

(10) Patent No.: US 8,623,230 B2
(45) Date of Patent: Jan. 7, 2014

(54) METHODS AND SYSTEMS FOR REMOVING A MATERIAL FROM A SAMPLE

(75) Inventors: Nicole Auth, Gustavsburg (DE); Petra Spies, Mainz (DE); Tristan Bret, Darmstadt (DE); Rainer Becker, Pfungstadt (DE); Thorsten Hofmann, Rodgau (DE); Klaus Edinger, Lorsch (DE)

(73) Assignee: Carl Zeiss SMS GmbH, Jena (DE)

( * ) Notice: Subject to any disclaimer, the term of this patent is extended or adjusted under 35 U.S.C. 154(b) by 348 days.

(21) Appl. No.: 12/744,586

(22) PCT Filed: Dec. 18, 2008

(86) PCT No.: PCT/EP2008/067909
§ 371 (c)(1),
(2), (4) Date: Jul. 15, 2010

(87) PCT Pub. No.: WO2009/080707
PCT Pub. Date: Jul. 2, 2009

(65) Prior Publication Data
US 2010/0282596 A1    Nov. 11, 2010

Related U.S. Application Data

(60) Provisional application No. 61/016,724, filed on Dec. 26, 2007.

(51) Int. Cl.
*H01L 21/302* (2006.01)
(52) U.S. Cl.
USPC .............. 216/64; 216/65; 216/66; 216/74; 216/78; 438/706; 438/720; 204/192.34

(58) Field of Classification Search
None
See application file for complete search history.

(56) References Cited

U.S. PATENT DOCUMENTS

| 5,600,146 | A |   | 2/1997  | Felker et al. |       |
|-----------|---|---|---------|---------------|-------|
| 5,683,547 | A | * | 11/1997 | Azuma et al.  | 216/66 |
| 6,182,605 | B1 |  | 2/2001  | Frosein       |       |
| 6,322,672 | B1 |  | 11/2001 | Shuman et al. |       |
| 6,365,905 | B1 |  | 4/2002  | Koyama et al. |       |
| 6,407,001 | B1 |  | 6/2002  | Scott         |       |
| 6,489,610 | B1 |  | 12/2002 | Barofsky et al. |     |

(Continued)

FOREIGN PATENT DOCUMENTS

| DE | 69 608 219 T2 | 9/2000 |
|----|---------------|--------|
| DE | 102 08 043    | 9/2001 |

(Continued)

OTHER PUBLICATIONS

Bonani, G. et al., Nuclear Instruments and Methods, vol. 157 (1), Nov. 1978, p. 55-63.

(Continued)

*Primary Examiner* — Anita Alanko
(74) *Attorney, Agent, or Firm* — Fish & Richardson P.C.

(57) ABSTRACT

The present method relates to processes for the removal of a material from a sample by a gas chemical reaction activated by a charged particle beam. The method is a multiple step process wherein in a first step a gas is supplied which, when a chemical reaction between the gas and the material is activated, forms a non-volatile material component such as a metal salt or a metaloxide. In a second consecutive step the reaction product of the first chemical reaction is removed from the sample.

37 Claims, 3 Drawing Sheets

(56) References Cited

U.S. PATENT DOCUMENTS

Figure 1:
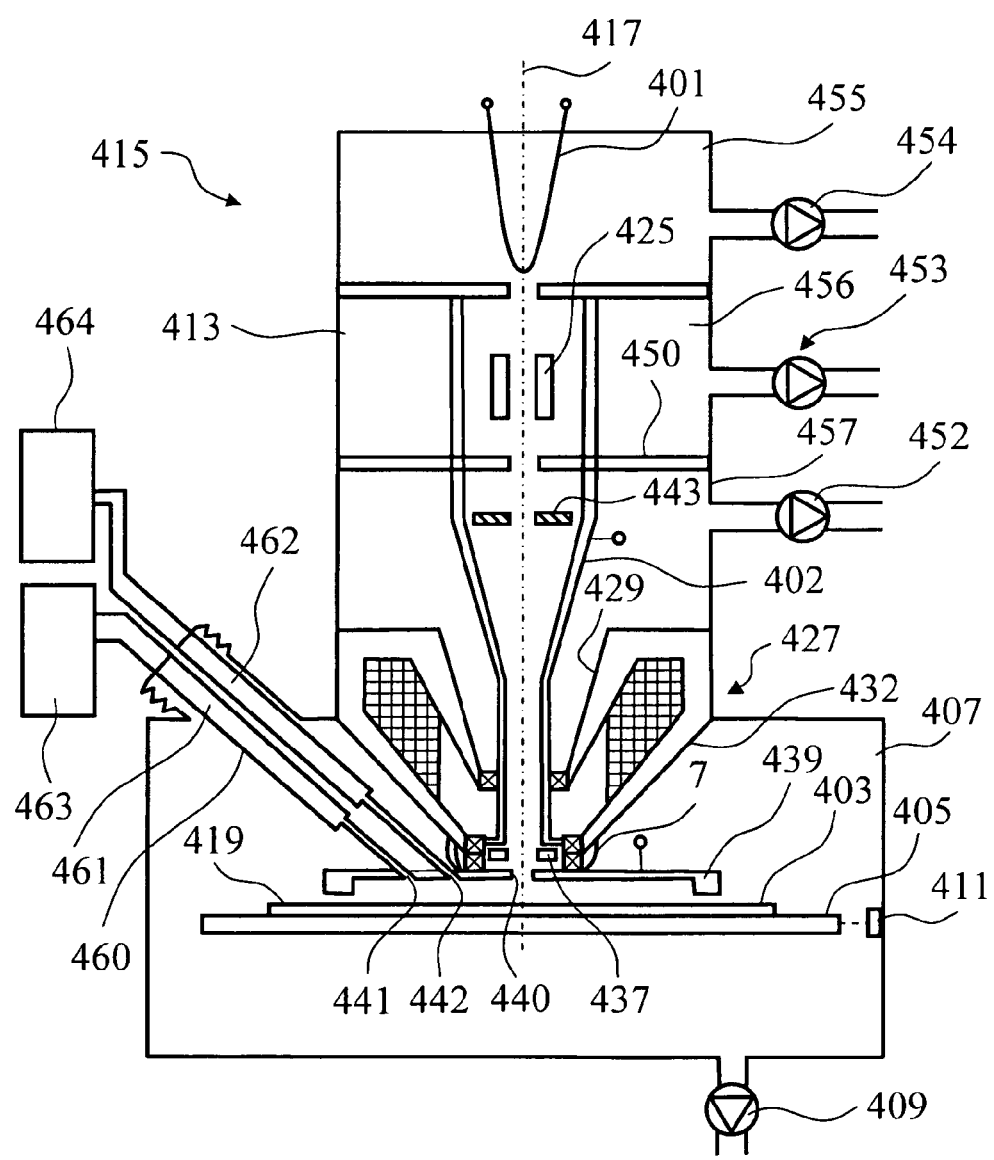

| | | | |
|---|---|---|---|
| 6,509,276 B2 * | 1/2003 | Scott | 438/712 |
| 6,514,866 B2 | 2/2003 | Russell et al. | |
| 6,580,072 B1 | 6/2003 | Chang et al. | |
| 6,787,772 B2 | 9/2004 | Ose et al. | |
| 6,787,783 B2 | 9/2004 | Marchman et al. | |
| 6,797,953 B2 | 9/2004 | Gerlach et al. | |
| 6,824,655 B2 | 11/2004 | Makarov et al. | |
| 6,863,787 B2 | 3/2005 | Huynh et al. | |
| 6,864,482 B2 | 3/2005 | Sato et al. | |
| 6,900,137 B2 | 5/2005 | Herschbein et al. | |
| 7,029,595 B1 | 4/2006 | Li et al. | |
| 7,148,073 B1 * | 12/2006 | Soltz et al. | 438/4 |
| 7,232,997 B2 * | 6/2007 | Edinger et al. | 250/311 |
| 7,238,294 B2 * | 7/2007 | Koops et al. | 216/62 |
| 7,452,477 B2 * | 11/2008 | Koops et al. | 216/62 |
| 7,537,708 B2 * | 5/2009 | Peter Koops et al. | 216/65 |
| 7,786,403 B2 * | 8/2010 | Koops et al. | 219/121.2 |
| 7,879,730 B2 * | 2/2011 | Naser-Ghodsi et al. | 438/706 |
| 7,945,086 B2 * | 5/2011 | Gotkis et al. | 382/149 |
| 8,052,885 B2 * | 11/2011 | Naser-Ghodsi et al. | 216/58 |
| 2004/0043621 A1 * | 3/2004 | Nasser-Ghodsi | 438/710 |
| 2004/0056249 A1 | 3/2004 | Russell et al. | |
| 2005/0072753 A1 * | 4/2005 | Koops et al. | 216/2 |
| 2006/0060790 A1 | 3/2006 | Nakasuji et al. | |
| 2006/0228634 A1 * | 10/2006 | Bret et al. | 430/5 |
| 2007/0138388 A1 | 6/2007 | Ward et al. | |

FOREIGN PATENT DOCUMENTS

| | | |
|---|---|---|
| DE | 101 22 957 | 11/2002 |
| DE | 69 633 505 T2 | 3/2005 |
| EP | 1 411 538 | 4/2004 |
| EP | 1 465 243 | 10/2004 |
| EP | 1 703 537 | 9/2006 |
| EP | 1 710 327 | 10/2006 |
| JP | 2004-312017 | 11/2004 |
| WO | WO 01/67502 | 9/2001 |
| WO | WO 03/019629 | 3/2003 |

OTHER PUBLICATIONS

Casey et al., Journal of Vacuum Science and Technology B 20 (2002) 2682, Nov./Dec. 2002.

Edinger et al., "Modelling of focused ion beam induced surface chemistry," J. Vac. Sci. Technol. B 18, 3190 (2000), Nov./Dec. 2000.

Edinger, Journal of Vacuum Science and Technology B 17 (1999) 3058, Nov./Dec. 1999.

Gonzalez et al., Journal of Vacuum Science and Technology B 19 (2001) 2539, Nov./Dec. 2001.

Gonzalez et al., Journal of Vacuum Science and Technology B 20 (2002) 2700, Nov./Dec. 2000.

Harriott, "Focused Ion Beam $XeF_2$ etching of materials for phase shift masks," J. Vac. Sci. Technol. B 11, 2200 (1993), Nov./Dec. 1993.

Koops et al., "Characterization and application of materials grown by electron-beam-induced deposition," Jpn. J. Appl. Phys., Part 1 33(12), 7099 (1994), Dec. 1994.

Koops et al., "Three-dimensional additive electron-beam lithography," SPIE vol. 2780 p. 388.

Kulkarni et al., Journal of The Electrochemical Society 149 (2002) G620, Oct. 9, 2002.

Mosselveld et al., Journal of Microscopy 214 (2004) 246, Jun. 2004.

Muray et al., "Experimental evaluation of an electron-beam pulse modulated blanker (160 MHz) for next-generation electron-beam raster scan systems," J..Vac. Sci. Technol. B 13, 2488 (1995), Nov./Dec. 1995.

Okayama, "Electron-beam Lithography System Using a Quadrupole Triplet," JVST B, 6,(1) (1988), 199-203, Jan./Feb. 1988.

Schwartz et al., Journal of the Electrochemical Society 130 (1983) 1777.

Stanishevsky et al., "testing new chemistries for mask repair with focused ion beam gas assisted etching," J. Vacuum Science and Technology B, vol. 21, No. 6, 2003, pp. 3067-3071, Nov./Dec. 2003.

* cited by examiner

METHODS AND SYSTEMS FOR REMOVING A MATERIAL FROM A SAMPLE

CROSS-REFERENCE TO RELATED APPLICATIONS

This application is the National Stage of International Application No. PCT/EP2008/067909, filed Dec. 18, 2008, which claims the benefit of U.S. Provisional Application Ser. No. 61/016,724, filed Dec. 26, 2007.

The present invention generally relates to methods and systems for removing a material from a sample. The present invention more particularly relates to methods and systems which provide the possibility of strongly localized beam induced chemical etching of an electrically conductive material, such as a metal, on a sample.

For analyzing defects of electronic components such as micro chips, for example micro processors, in the semiconductor industry it is desirable to change the interconnection between individual active elements in order to be able to test in a quick and cost effective manner design changes in the layout of the chip or processor. For this task it is furthermore desirable to uncover electrically conductive metallic lines within the component and to disconnect them from other circuit lines, to etch a via into the selected layers and/or to edit new interconnections.

The ability to remove layers or structures at selected locations on a wafer additionally is desirable for defect review and analysis in semiconductor device manufacturing processes, for example to provide a better view of a defect or a better investigation thereof in the case that the defect is a subsurface defect or a partially subsurface defect. Additionally removing a localized region of a layer may be useful to be able to investigate the localized behaviour of the systems without or with reduced interference with surrounding regions of a layer.

Because the interconnections within semiconductor components comprise or consist of metals such as copper, it is desirable to remove a metal, in particular copper from a sample.

In the prior art several methods and systems for removing metal from a sample have been described. Regarding the prior art the following documents are of particular relevance: G. C. Schwartz et al., Journal of The Electrochemical Society 130 (1983) 1777, K. Edinger, Journal of Vacuum Science and Technology B 17 (1999) 3058, J. C: Gonzalez et al., Journal of Vacuum Science and Technology B 19 (2001) 2539, N. S. Kulkarni et al., Journal of The Electrochemical Society 149 (2002) G620, J. D. Casey et al., Journal of Vacuum Science and Technology B 20 (2002) 2682, J. C. Gonzalez et al., Journal of Vacuum Science and Technology B 20 (2002) 2700, F. Mosselveld et al., Journal of Microscopy 214 (2004) 246, US20040056249A1, U.S. Pat. No. 6,322,672, WO2001067502A2, U.S. Pat. No. 6,407,001, U.S. Pat. No. 6,509,276, U.S. Pat. No. 6,514,866, U.S. Pat. No. 6,580,072, U.S. Pat. No. 6,787,783, U.S. Pat. No. 6,824,655, WO2003019629A2, U.S. Pat. No. 6,863,787, EP1465243A2, JP2004312017, U.S. Pat. No. 6,900,137, U.S. Pat. No. 7,029,595, U.S. Pat. No. 7,148,073.

The methods and systems disclosed in the prior art in part have advantages but also all suffer one or more disadvantages. The FIB based systems normally work with a liquid metal ion beam source with which a strongly localized chemical etching or ion beam milling can be performed. However the ion beam also causes implantation of metal ions, such as Gallium ions, into the sample which thereby causes irreversible chemical changes within the sample. Such ion implantation can be avoided by using an electron beam for activating a desired chemical reaction such as described in U.S. Pat. No. 7,148,073. However often the depth within which the desired chemical reaction takes place is insufficient.

It is therefore an object of the invention to provide methods and systems with which an efficient removal of a material, such as an electrically conductive material like a metal, in particular of copper, can be performed in a strongly localized manner and which does not absolutely necessitate an ion beam.

According to a first embodiment of the invention this object is solved with a method for removing a material from a sample, comprising the steps: a) providing a beam of electrons, b) providing a gas flux to the sample, the gas comprising nitrogen, and c) activating a chemical reaction between the gas and the material by the beam of electrons.

In an embodiment the material is electrically non-conductive. In a further particular embodiment the material is a metal, particularly copper.

In an embodiment the gas comprises a nitrogen oxide, in particular nitrogen dioxide. It can be shown that nitrogen oxide can be activated by the electron beam and the oxygen of the nitrogen oxide then oxidizes the metal. The oxidization only occurs in a region where the electron beam impinges on the sample or the metal. In a consecutive step the metal oxide then can be removed from the sample. For removing the metal oxide light can be supplied. In another embodiment the metal oxide is removed by providing a flux of a second gas to the sample and a consecutive chemical reaction between the second gas and the metal oxide. In this embodiment the second gas can be selected in a manner that it undergoes a reaction with the reaction product, i.e. the metal oxide, when the second chemical reaction is activated, for example also by the electron beam.

The removed metal can be copper. Investigations have shown that in particular copper can be oxidized by an electron beam activated chemical reaction with nitrogen dioxide.

A second embodiment of the method for removing material from a sample, comprises the steps: a) providing a beam of charged particles, b) providing a gas flux to the sample, the gas comprising an oxygen being capable of oxidizing the material when a chemical reaction between the gas and the material is activated by the beam of charged particles, and c) activating the chemical reaction by the beam of charged particles to form a material oxide.

In an embodiment the material is electrically non-conductive. In a further particular embodiment the material is a metal, particularly copper.

It should be noted that the activation of the chemical reaction can be performed by an ion beam or an electron beam. However ions which only show a moderate ion implantation such as helium ions or electrons are preferred for activating the chemical reaction.

In a consecutive step the material oxide can be removed from the sample. Also in this embodiment the material oxide can be removed from the sample by supplying light to the sample.

In another embodiment the material oxide is removed by providing a flux of a second gas to the sample. In this embodiment the second gas is selected in a manner that it can undergo a second chemical reaction with the reaction product, i.e. the material oxide. In an embodiment the second chemical reaction can be activated by the beam of charged particles and the method comprises the further step of activating the second chemical reaction. In this manner a chemical reaction of the second gas in other regions than the ones in which activation of the second chemical reaction is performed can be avoided.

The activation of the second chemical reaction can be performed by the beam of charged particles.

In an embodiment the material is electrically non-conductive. In a further particular embodiment the material is a metal, particularly copper.

The metal to be removed again can be copper but also can be another metal other than copper.

In a third embodiment the method for removing material from a sample comprises the steps of: a) providing a beam of charged particles, b) providing a first gas component to the sample, c) providing a second gas component to the sample, d) activating a first chemical reaction between the first gas and the material by the beam of charged particles, wherein the first gas, when the first chemical reaction is activated by the beam of charged particles, forms an non-volatile material composition, and e) activating a second chemical reaction by the beam of charged particles between the second gas and the non-volatile material composition, which second chemical reaction forms a volatile composition with the non-volatile material composition.

In an embodiment the material is electrically non-conductive. In a further particular embodiment the material is a metal, particularly copper.

In a particular embodiment the non-volatile material composition can be an electrically non-conductive material composition such as a metal oxide or a metal salt. The metal salt can in particular be a metal halogenide. To form a metal halogenide or a metal oxide the first gas can comprise oxygen or a halogen. The gas also can comprise nitrogen. In a more particular embodiment the first gas comprises a nitrogen oxide, in particular nitrogen dioxide.

The second gas also can comprise a halogen or oxygen. In particular the second gas can comprise xenon difluoride.

The charged particle beam for activating the first and/or the second chemical reaction can be an electron beam, however also can comprise an ion beam, in particular an ion beam with ions which only show a low implantation rate such as Helium.

The flux of the second gas can be provided in repeating successive steps. With such a method it is possible to successively remove thin layers of the material composition to prevent a slowing down or stopping of the chemical reaction between the first gas and the material because of the formed non-volatile material compositions. In a particular embodiment the duty cycle of the flux of the second gas is less than 1:2, preferable less than 1:5 which means that the second gas only is provided less than half the time to avoid or reduce a chemical reaction between the second gas and the material.

Alternatively to supply the second gas in repeating successive steps the second gas can be provided with a flow rate which is lower than the flow rate of the first gas.

Again, also within this embodiment the material can be an electrically conductive material such as a metal, in particular copper.

The above described methods can be carried out with a charged particle beam scanned across the metal to be removed. In a very particular embodiment the scanning frequency with which the charged particle beam is scanned has a pixel frequency of 10 MHz or more.

A fourth embodiment of the invention comprises a method for removing a material from a sample, comprising the steps of: a) providing a beam of charged particles, b) providing a flux of a gas to the sample, c) activating a chemical reaction between the gas and the material by the beam of charged particles, wherein the gas, when the chemical reaction is activated by the beam of charged particles, forms an non-volatile material composition, d) removing the non-volatile material composition from the sample, and e) repeating the steps a) to d) in repeating successive steps.

In an embodiment the material is electrically non-conductive. In a further particular embodiment the material is a metal, particularly copper.

The non-volatile material composition can be electrically non-conductive. This provides the advantage that—at least for electrical investigations—the non-volatile material composition does not need to be removed completely but small parts of the material composition can remain on the sample because they do not provide an electrical connection.

The material to be removed can be an electrically conductive material, such as a metal, in particular copper.

The gas can comprise oxygen or a halogen. In particular the gas can comprise nitrogen or a nitrogen composition such as nitrogen oxide or nitrogen dioxide.

According to another aspect of the invention an apparatus for removing a material on a sample, comprises a source of charged particles, a probe forming charged particle optical system with which a beam of charged particles emitted by the charged particle source is formed, a first gas inlet and a second gas inlet, a control system for controlling a gas flux through the first gas inlet and a gas flux through the second gas inlet, a first gas container connected to the first gas inlet and a second gas container connected to the second gas container, wherein the first container comprises a gas which, when a first chemical reaction is activated by the beam of charged particles, undergoes a chemical reaction with the material forming a non-volatile material composition, and wherein the second gas container comprises a gas which, when a second chemical reaction is activated by the beam of charged particles, forms a volatile composition with the non-volatile material composition.

In an embodiment the material is electrically non-conductive. In a further particular embodiment the material is a metal, particularly copper.

In a particular embodiment of an apparatus the first gas container comprises nitrogen dioxide or a halogen, in particular chlorine or bromine. Furthermore the second gas container can comprise a halogen or a halogen compound.

The apparatus should comprise a beam deflecting system with which the charged particle beam can be scanned across the sample or the metal to be removed. The beam deflecting system can provide a deflection bandwidth of 10 MHz or more.

Figure 2:
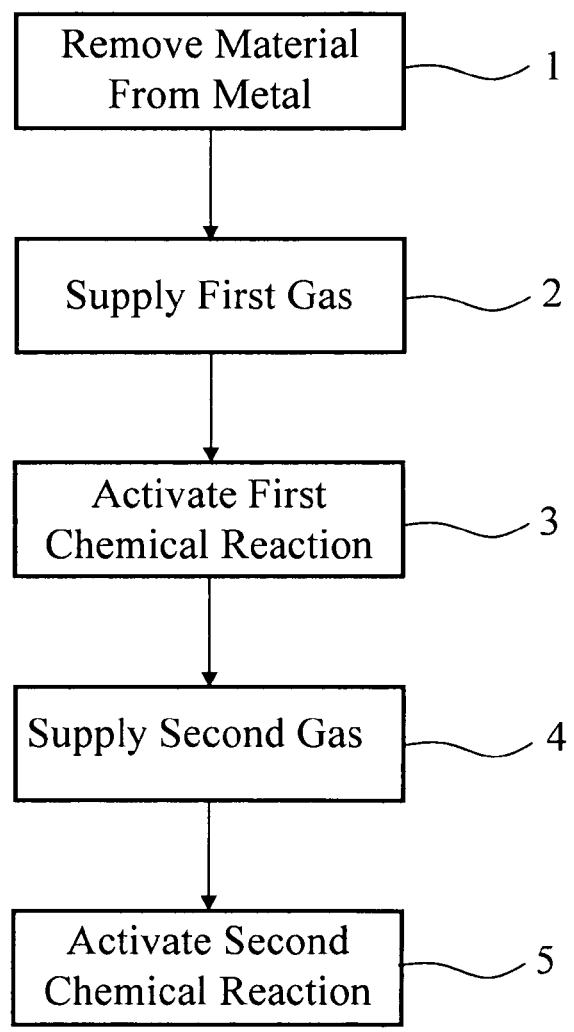

Additional advantageous embodiments are disclosed within the dependent claims and the following description in which the invention is disclosed with reference to the appended drawings. Thereby shows:

FIG. 1: A system according to a first embodiment of the invention,

FIG. 2: A flow diagram showing the steps within particular embodiments of the invention.

Figure 3:
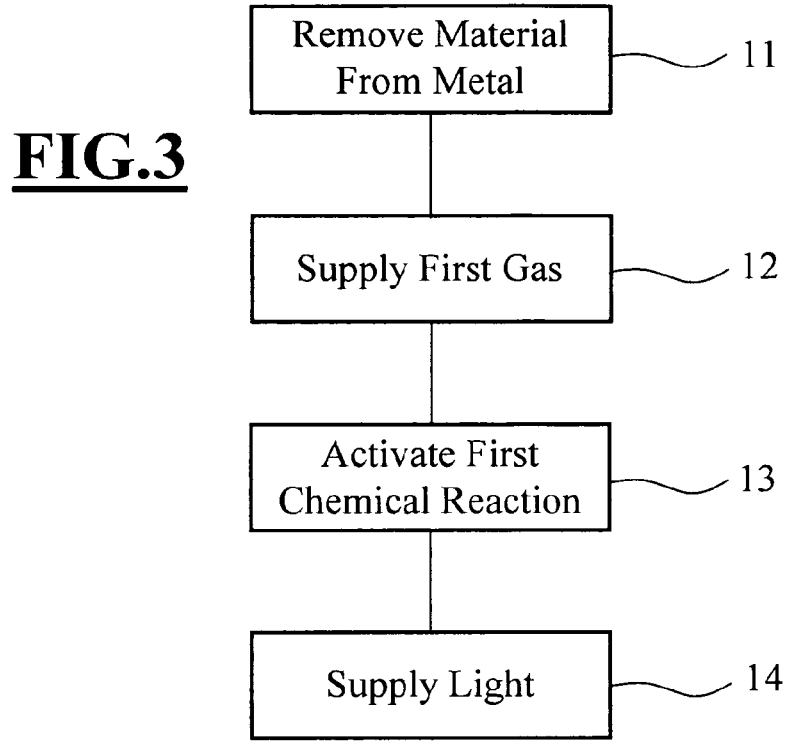

FIG. 3: A flow diagram showing the steps within other particular embodiments of the invention.

Figure 4A:
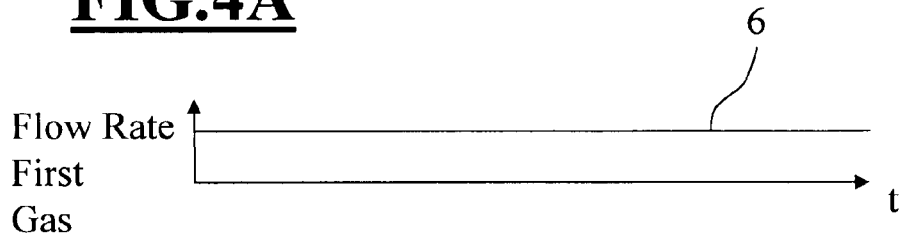

FIG. 4*a*: A graphical representation showing the supply of a first gas as a function of time.

Figure 4B:
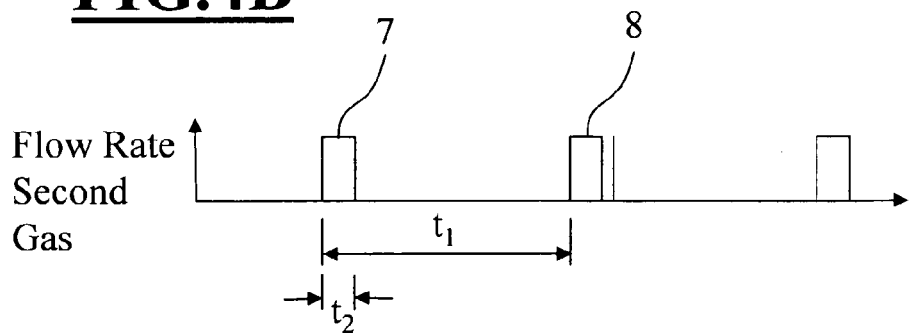

FIG. 4*b*: A graphical representation showing the supply of a second gas in repeating steps as a function of time.

In the following, presently preferred embodiments of the claimed apparatus and the claimed method are described with particular reference to a scanning electron microscope. However, it is to be understood that the present invention can be used for any apparatus, wherein electrically charged particles are used to study, image or modify a sample either on its surface or in its interior regions, in particular also for ion microscopes, such a a Helium ion microscope. A particular important field of use is to modify microelectronic circuits in the semiconductor industry. In this case the scanned electron beam is used to selectively deposit or remove material, in particular a metal layer of a semiconductor chip or from a wafer.

FIG. 1 presents a schematic vertical cross-section of an embodiment of the invention. This system is used to process a work piece 403, namely a microelectronic circuit or a wafer. The material processing system 1 allows changing such structures by material deposition at selected locations and by material removal from selected locations.

The material deposition is effected herein by supplying a reactive gas (precursor) to the proximity of the location selected for the process. At the same time, an electron beam of primary electrons is directed to the selected location. Primary electrons, or backscattered or secondary electrons released from the work piece by the primary electrons, activate the reactive gas so that components of the reactive gas are deposited at the selected locations or in close proximity thereto. As a result, the desired material deposition is effected in the area of the selected location.

The material removal is effected in a similar way. However, a different reactive gas is supplied which is activated by the primary electrons, or backscattered or secondary electrons generated by the primary electrons, such that the reactive gas reacts with the material of the work piece at the selected location or in close proximity thereto and converts components of the material to a gaseous or vapour compound which escapes from the work piece. Thus the desired material removal is achieved in the area of the selected location.

To this end, the work piece is mounted on a work piece holder 405. The work piece 403 and the work piece holder 405 are disposed in a processing chamber 407 which may be evacuated by means of a turbo molecular pump 409 and a further pre-vacuum pump not shown in FIG. 1.

A spatial position of the work piece holder relative to the processing chamber can be changed in the three spatial directions x, y, z by means of actuators not shown in FIG. 1. Plural laser interferometers 411 are provided to detect the position of the work piece holder 405 relative to the processing chamber 407.

An electron microscope 415 is mounted in a vacuum enclosure 413 of the processing chamber 407 such that the optical axis 417 of the electron microscope 415 extends in z-direction and a sample plane 419 of the electron microscope 415 is within the processing chamber 407. The work piece holder 405 is positioned within the processing chamber 407 such that a surface of the work piece 403 is disposed substantially in the sample plane 419 of the electron microscope, i.e. in that plane in which a focussed probe of electrons (constituting the charged particle probe) is generated.

The electron microscope 415 comprises an electron source 401 and a magnetic coil 425 acting as a condenser to form an electron beam from electrons emitted from the electron source 401. The electron beam is directed downwardly along an optical axis 417. An objective lens 427 of the electron microscope 415 comprises an upper pole piece 429 and a lower pole piece 431, a coil 432 being provided there between. The pole pieces 429, 433 define a pole piece gap toward the optical axis 417 of the overall system, which concurrently forms the optical axis of the objective lens 427. The objective lens 427 focuses the electron beam in the sample plane 419 of the electron microscope 415, i.e. in the sample plane an electron probe with a small cross-section in the range of a 1-10 nanometers is formed.

The electron microscope 415 further comprises an electrostatic immersion lens which is formed by an upper electrode 402 and a lower electrode 433. The upper electrode extends from the anode 404 of the electron source 401 through the complete electron optical column and ends at the lower pole piece 431 of the objective lens 427. The lower electrode 433 of the electrostatic immersion lens is arranged—in the direction of propagation of electrons emitted by the electron source 401—downstream of the lower pole piece of the objective lens. The upper electrode 402 is supplied with an anode potential, the lower electrode 433 is supplied with a potential with is negative compared to the anode potential and should be the same as the potential of the sample. Therefore, by the action of the electrostatic immersion lens primary electrons are—when passing the objective lens 427—decelerated from a higher kinetic energy corresponding to the anode potential to a lower kinetic energy corresponding to the difference between the anode potential and the potential of the lower electrode 433. Preferably the kinetic energy of the electrons downstream of the lower electrode is 5 keV or less.

Following downstream of the lower electrode 433 an electrostatic deflection element 437 is provided. The electrostatic deflection element is formed by small electrodes which form an electrostatic multipole and serve to deflect the electron beam perpendicularly to the optical axis 417 in the x-direction and in the y-direction. A controller (not shown) is provided to control the voltage supplied to the electrodes of the deflection element 437 and thus the deflection of the electron probe in the sample plane 419.

In the direction of propagation of primary electrons emitted by the electron source 401 downstream of the deflection element 437 an electrically conductive shielding element 439 is provided. This shielding element 439 can be formed as a flat extended electrode or in the form of a grid or mash. The shielding element 439 serves to reduce disturbing influences of charges accumulated on the surface of the sample 403 on the primary electron beam. The shielding element has a hole 440 in the region of the optical axis 417 to allow the primary electron beam to pass through.

The shielding element 439 at least has one or two additional holes 441, 442 through which gas molecules emitted from the terminating portions of a gas supply system 443 can reach the surface of the sample 403 in close proximity to the optical axis. By the aid of the gas supply system either a pre-cursor gas or a reactive gas can be supplied as required for the actual application.

In the column, in the focal plane of the objective lens 427 directed to the side of the electron source 401, a further electrostatic deflection element 435 is provided which can be operated in cooperation with the deflection element 437 arranged downstream of the objective lens 427 in a manner which will be described in more detail below.

An in-lens detector 443 is arranged in the electron optical column upstream of the objective lens 427 between the condenser lens 425 and the objective lens. This in-lens detector serves for detecting either backscattered electrons or secondary electrons emitted by the sample because of the impinging primary electron beam. The detection signal of the in-lens detector 443 is read out by a controller. To take an electron microscopic image of the work piece 403 in a portion disposed in the object plane 419 around the optical axis 417 the controller controls either the first deflection element 437 or the second deflection element 435 such that the electron probe systematically scans the portion. The signal intensities recorded by the in-lens detector 443 in the dependence of the deflection are stored by the controller for further processing and/or display.

As further shown in FIG. 1 two pressure limiting apertures 450, 451 are provided between the electron source 401 and the objective lens 427 so that the vacuum system 413 between the electron source 401 and the objective lens 427 is split-up into three vacuum stages 455, 456, 457 each of which is evacuated by a separate appropriate vacuum pump 452, 453, 454 so that in each of the stages an appropriate vacuum can be maintained.

The electrostatic deflection element 437 can be formed in the form of an octupole which is preferably made from a non-magnetic material and will therefore not change an additional magnetic field, which may protrude lower electrode 433 of the electrostatic immersion lens. For an electrostatic insulation of the octupole its electrodes are insulated with respect to the support ring 7 with which the octupole is mounted to the lower pole piece 431 of the objective lens 427.

The octupole 437 can have eight cylindrical electrodes. An insulating space between the electrodes of the octupole is left without material to avoid charging of any insulating surface, which could eventually lead to sudden discharges and result in instability of the electron beam. Alternatively, the octupole can also be constructed, as often commonly used, with slots as insulating space between segments of a circular bore, or from a set of pole piece blades pointing to a common center and having an insulating space in between (not shown).

The small size of the octupole having in the described embodiment an inner diameter between 5 mm and 1 mm and an electrode length between 20 mm and 0.05 mm, as well as the use of thin potential feeding wires (not shown), which are insulated with respect to the support ring 7, limits the involved capacities to less than 50 pF preferably less than 10 pF and allows therefore very high frequencies e.g. 10 MHz to 10 GHz as deflection frequency. As a result the required minimum pixel dwell time of 100 nanoseconds or less can be achieved.

The gas supply system 460 has several gas supply pipes of which two pipes 461, 462 are shown in FIG. 1. The gas supply pipes are each connected to a gas container 463, 464 which are filled with a particular gas. In one embodiment one gas container includes cooled nitrogen dioxide and another gas container includes cooled xenon-difluoride. In another embodiment one gas container includes chlorine and another gas container includes cooled xenon-difluoride. Other gas containers can comprise additional gases, for example precursor gases which provide the possibility to deposit a particular material by an electron beam induced deposition.

The gas supply pipes terminate in holes 441, 442 in the shielding plate 439. At its terminating end each pipe comprises a computer controlled micro-valve (not shown) with which the flux of process gas through the pipe can be controlled according to a predefined sequence. In particular the micro-valves can be opened and closed in a sequential manner resulting in a so called shopped gas supply, i.e. the respective gas can be supplied in repeating successive steps.

Following a first embodiment for a process for removing a metal, such as copper, will be described with respect to FIG. 2. In a first step 1 any material covering the metal structure will be removed in a manner that the electron beam as well as the process gases have access to the metal layer at the desired position. This can be done in known manner, for example by electron beam induced etching of vias through the covering layers or by a similar method as described herein.

In a second step 2 a first precursor gas is supplied through one of the gas supply pipes. In a first activation step 3 (third step) by the electron beam a first chemical reaction between the metal and the first precursor gas is activated. The activated first chemical reaction produces a non volatile, metal component in the regions—and only in the regions—activated by the electron beam. In the case that the metal is copper, the first precursor gas can in one embodiment be nitrogen-dioxide. The resulting copper-oxide compound is electrically non-conductive and non volatile. In another embodiment the first precursor gas is chlorine, which, when the first chemical reaction is activated, forms with the copper in the metal layer copper chlorine. If other metals are present instead or additionally to copper, respective other metal-oxide compounds are formed. Additionally, if instead of chlorine another halogen is supplied as the first gas a respective other metal-halogenide is formed in the first chemical reaction. The metal-oxide compounds and metal halogenides are electrically non-conducting and non volatile.

In the third step 3 the first chemical reaction is activated by a beam of charged particles. If the apparatus as shown in FIG. 1 is used, the beam of charged particles is an electron beam. In the course of the first chemical reaction a non-volatile metal component, such as a metal salt or a metal oxide is formed.

In a fourth step 4 a second gas is supplied through another one of the gas supply pipes. Now in a second activation step 5 by the charged particle beam, e.g. the electron beam, another, second chemical reactions is activated in regions in which during the first chemical reaction the metal oxide or metal halogenide has been formed. In the second chemical reaction the second precursor gas undergoes a chemical reaction with the metal oxide or metal halogenide and forms a metal component which is volatile and therefore will leave the processed sample. The second precursor gas is supplied in such small quantities and/or such small duty cycles that it does not, or only to a very small extend, undergo a chemical reaction with the metal itself which then forms a metal component which cannot (or only hardly) be removed again. For example, the second precursor gas can be xenon-difluoride.

The steps starting with the second step 2 through the final removal step 5 can be repeated for several times which is particular useful if a thicker metal layer has to be removed.

In the embodiment in which the first precursor gas is nitrogen dioxide and the second precursor gas is xenon difluoride the nitrogen dioxide can be supplied in a continuous flux of 0.3 sccm. The xenon difluoride can be operated at a gas temperature of $-5°$ C. and be supplied in a 30 s sequence with a duty cycle of 1:9. This means that the valve of the respective gas pipe through which the xenon difluoride is supplied only is opened each 30 seconds for a time period of 3 seconds and is closed the remaining 27 seconds. Because of the very small amount of xenon difluoride supplied it has been shown that the process provides a quite well selectivity between the copper oxide and the surrounding materials because the nitrogen dioxide does not react with most other materials than metals. During the above process a dwell time of 1 µs and a refresh time of 1 ms can be used which means that the electron probe only impinges on a particular location on the sample for 1 µs until it is moved to another location and only impinges on the same location for a second or consecutive time 1 ms or more after it has impinged at that location before.

The supply of gases in a respective process is shown in FIGS. 4*a* and 4*b*. In FIG. 4*a* the flow rate 6 of the first gas is shown as a function of time. The flow rate of the first gas is constant over time.

In FIG. 4*b* the flow rate of the second gas is also shown as a function of time, however the second gas is supplied in a pulse wise fashion in that the valve of the second supply line only is opened for relatively short opening times t2 between which there are longer time intervals t1 in which the valve is closed. The time interval t1 denotes the sequence of the gas supply, the quotient t2/t1 denotes the duty cycle of the gas supply.

In the embodiment in which the first precursor gas is chlorine and the second precursor gas is xenon difluoride the chlorine can be supplied in a continuos flux of 0.1 sccm. The xenon difluoride can be operated at a gas temperature of 0° C. and be supplied in a 30 s sequence with a duty cycle of 1:5. This means that the valve of the respective gas pipe through which the xenon difluoride is supplied only is opened each 30 seconds for a time period of 5 seconds and is closed the remaining 25 seconds. This reaction is highly selective between the metal and surrounding materials because of the very high reaction velocity between metal, such as copper, and chlorine. During this process a dwell time of 0.1 μs and a refresh time of 200 μs can be used which means that the electron probe only impinges on a particular location on the sample for 0.1 μs until it is moved to another location and only impinges on the same location for a second or consecutive time 200 μs or more after it has impinged at that location before.

To provide a dwell time of 0.1 μs the deflection system by the aid of which the electron probe is moved across the sample needs to have a deflection bandwidth of at least 10 MHz.

Because the metal component formed in the first step of the process is electrically non-conducting for many applications it is not absolutely necessary to completely remove the reaction product generated in the third process step 3 completely in the fifth process step 5 because electrically non conduction residuals remaining on the sample do not disturb as long as in the fifth process step 5 sufficient reaction products formed in the third process step are removed so that in consecutive repeating first steps a chemical reaction between the metal and the first reaction gas occurs.

The process in which chlorine is used for the first precursor gas can form part of a so called via-etch process in which a lower portion of a via is etched by the chlorine.

Additionally to etching or removing the metal or portions of a metal from the sample, for example to disconnect particular microelectronic components or to interrupt electrical connections the above described system also can be used to produce new electrical connections by depositing metal at desired locations by an electron beam induced deposition process.

In FIG. 3 the process steps of an alternative embodiment are shown. In a first step 11 any material covering the metal structure will be removed in a manner that the electron beam as well as the process gases has access to the metal layer at the desired position. This can be done in known manner, as described above.

In a second step 12 again a first precursor gas is supplied through one of the gas supply pipes. In a first activation step 13 by the electron beam a first chemical reaction between the metal and the first precursor gas is activated. The activated first chemical reaction again produces a non-volatile metal component in the regions—and only in the regions—activated by the electron beam. In the case that the metal is copper, the first precursor gas can in one embodiment be nitrogen-dioxide. The nitrogen dioxide forms with the copper in the metal layer a copper-oxide compound, which is electrically non-conductive and non volatile. In another embodiment the first precursor gas is chlorine, which, when the first chemical reaction is activated, forms with the copper in the metal layer copper chloride. If other metals are present instead or additionally to copper, respective other metal-oxide compounds or metal chlorines are formed. Additionally, if instead of chlorine another halogen is supplied as the first gas a respective other metal-halogenide is formed in the first chemical reaction. The metal-oxide compounds and metal halogenides are electrically non-conducting and non volatile.

In a fourth step 14 light, for example a laser pulse is provided to impinge in the region in which in the third step 13 the non-volatile metal component has been formed. Due to the laser beam the sample is locally heated to a temperature at which the metal-component is no longer volatile and therefore the metal component desorbs into the sample chamber.

The invention claimed is:

1. A method comprising:
   using a beam of charged particles to activate a chemical reaction between a first gas and a material of a sample to form a non-volatile reaction product; and
   removing the non-volatile reaction product from the sample,
   wherein:
   the first gas comprises nitrogen and oxygen;
   the material of the sample comprises an element; and
   the non-volatile reaction product comprises the element and oxygen.

2. The method of claim 1, wherein the material of the sample is an electrically conductive material.

3. The method of claim 2, wherein the electrically conductive material is a metal.

4. The method of claim 1, wherein the first gas comprises a nitrogen oxide.

5. The method of claim 1, wherein first the gas comprises nitrogen dioxide.

6. The method of claim 1, wherein the non-volatile reaction product is removed by supplying light to the sample.

7. The method of claim 1, wherein the non-volatile reaction product is removed by providing a second gas to the sample, the second gas being different from the first gas.

8. The method of claim 7, further comprising activating a chemical reaction between the second gas and the non-volatile reaction product to remove the non-volatile reaction product from the sample.

9. The method of claim 8, further comprising using the beam of charged particles to activate the chemical reaction between the second gas and the non-volatile reaction product.

10. The method of claim 1, wherein the material of the sample is copper.

11. A method comprising:
    using a beam of charged particles to activate a chemical reaction between a first gas and a material of a sample to form a non-volatile reaction product, the sample comprising an element, and the non-volatile reaction product comprising an oxide of the element; and
    removing the non-volatile reaction product from the sample,
    wherein the first gas comprises nitrogen and oxygen.

12. The method of claim 11, wherein the material of the sample is an electrically conductive material.

13. The method of claim 12, wherein the electrically conductive material is a metal.

14. A method comprising:
    using a beam of charged particles to activate a chemical reaction between a first gas and a material of a sample to provide a non-volatile material; and
    using the beam of charged particles to activate a chemical reaction between a second gas and the non-volatile material to provide a volatile material,
    wherein the second gas is provided to the sample in repeating successive steps at a duty cycle that is less than 1:2.

15. The method of claim 14, wherein the material of the sample is electrically conductive, and the non-volatile material is electrically non-conductive.

16. The method of claim 15, wherein the non-volatile comprises a metal-oxide compound or a metal halogenide.

17. A method comprising:
a) using a beam of charged particles to activate a chemical reaction between a first gas and a material of a sample to form a non-volatile material;
b) removing the non-volatile material from the sample by reacting the non-volatile material with a second gas which is different from the first gas, a flux of the second gas to the sample being less than a flux of the first gas to the sample; and
c) repeating a) and b successively.

18. The method of claim 1, wherein the first gas comprises nitrogen dioxide, the material comprises copper, and the non-volatile reaction product comprises copper and oxygen.

19. The method of claim 6, wherein the first gas comprises nitrogen dioxide, the material comprises copper, and the non-volatile reaction product comprises copper and oxygen.

20. The method of claim 7, wherein the second gas comprises $O_2$ or a halogenide.

21. The method of claim 20, wherein the material of the sample comprises a metal.

22. The method of claim 7, wherein the material comprises copper, the non-volatile reaction product comprises copper and oxygen, and the second gas comprises $O_2$ or a halogenide.

23. The method of claim 11, wherein the non-volatile reaction product is removed by supplying light to the sample.

24. The method of claim 11, wherein the non-volatile reaction product is removed by providing a second gas to the sample, the second gas being different from the first gas.

25. The method of claim 24, further comprising activating a chemical reaction between the second gas and the non-volatile reaction product to remove the reaction product from the sample.

26. The method of claim 25, further comprising using the beam of charged particles to activate the chemical reaction between the second gas and the non-volatile reaction product.

27. The method of claim 1, wherein the beam of charged particles comprises an electron beam.

28. The method of claim 1, wherein the beam of charged particles comprises an ion beam.

29. The method of claim 11, wherein the beam of charged particles comprises an electron beam.

30. The method of claim 11, wherein the beam of charged particles comprises an ion beam.

31. The method of claim 14, wherein the beam of charged particles comprises an electron beam.

32. The method of claim 14, wherein the beam of charged particles comprises an ion beam.

33. The method of claim 14, wherein duty cycle is 1:5.

34. The method of claim 14, wherein:
the first gas comprises nitrogen and oxygen;
the material of the sample comprises an element; and
the non-volatile reaction product comprises the element and oxygen.

35. The method of claim 17, wherein the beam of charged particles comprises an electron beam.

36. The method of claim 17, wherein the beam of charged particles comprises an ion beam.

37. The method of claim 17, wherein:
the first gas comprises nitrogen and oxygen;
the material of the sample comprises an element; and
the non-volatile reaction product comprises the element and oxygen.

* * * * *

UNITED STATES PATENT AND TRADEMARK OFFICE
CERTIFICATE OF CORRECTION

| | | |
|---|---|---|
| PATENT NO. | : 8,623,230 B2 | Page 1 of 1 |
| APPLICATION NO. | : 12/744586 | |
| DATED | : January 7, 2014 | |
| INVENTOR(S) | : Nicole Auth et al. | |

It is certified that error appears in the above-identified patent and that said Letters Patent is hereby corrected as shown below:

In the Specification:

Col. 4, line 67, delete "a a" and insert -- a --.

Col. 9, line 3, delete "continuos" and insert -- continuous --.

In the Claims:

Col. 10, line 25, in Claim 5, delete "first the" and insert -- the first --.

Col. 11, line 10, in Claim 17, delete "b" and insert -- b) --.

Signed and Sealed this
Thirteenth Day of May, 2014

Michelle K. Lee
*Deputy Director of the United States Patent and Trademark Office*